US012789231B2

(12) United States Patent
Qin et al.

(10) Patent No.: US 12,789,231 B2
(45) Date of Patent: Nov. 10, 2026

(54) ULTRASONIC TRANSDUCER DEVICE AND DISPLAY APPARATUS

(71) Applicants: Beijing BOE Technology Development Co., Ltd., Beijing (CN); BOE Technology Group Co., Ltd., Beijing (CN)

(72) Inventors: Yunke Qin, Beijing (CN); Yue Tong, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 112 days.

(21) Appl. No.: 18/992,950

(22) PCT Filed: Apr. 17, 2024

(86) PCT No.: PCT/CN2024/088347
§ 371 (c)(1),
(2) Date: Jan. 9, 2025

(87) PCT Pub. No.: WO2024/244774
PCT Pub. Date: Dec. 5, 2024

(65) Prior Publication Data
US 2025/0360537 A1 Nov. 27, 2025

(30) Foreign Application Priority Data
May 26, 2023 (CN) ......................... 202310609058.5

(51) Int. Cl.
*H10K 59/40* (2023.01)
*B06B 1/02* (2006.01)
(Continued)

(52) U.S. Cl.
CPC ........ *B06B 1/0207* (2013.01); *G02F 1/13338* (2013.01); *G06V 40/1306* (2022.01); *H10K 59/40* (2023.02)

(58) Field of Classification Search
CPC G02F 1/13338; H10K 59/40; G06V 40/1306; B06B 1/0207
See application file for complete search history.

(56) References Cited

U.S. PATENT DOCUMENTS 8,098,915 B2 * 1/2012 Schneider ............ G01N 29/343 382/128
8,183,745 B2 * 5/2012 Trolier-Mckinstry ........................ B06B 1/0629 310/368

(Continued)

FOREIGN PATENT DOCUMENTS

CN 106249457 A 12/2016
CN 108446685 A 8/2018

(Continued)

OTHER PUBLICATIONS

CN 202310609058.5 first office action dated Apr. 21, 2025.

*Primary Examiner* — Abdallah Abulaban
*Assistant Examiner* — Amie M Ndure
(74) *Attorney, Agent, or Firm* — IPro, PLLC

(57) ABSTRACT

An ultrasonic transducer device, including a base substrate, the base substrate including multiple ultrasonic units distributed in an array, and each ultrasonic unit including: a thin film transistor circuit disposed on the base substrate; at least one first ultrasonic transducer, disposed at a side of the thin film transistor circuit facing away from the base substrate, the first ultrasonic transducer including a first electrode, a first vibrating film layer and a second electrode stacked on the side of the thin film transistor circuit facing away from the base substrate, a cavity being provided between the first electrode and the first vibrating film layer, the first electrode being electrically connected to the thin film transistor circuit, and the second electrode being electrically connected to a driving voltage wire.

20 Claims, 15 Drawing Sheets

(51) Int. Cl.

| | |
|---|---|
| ***G02F 1/1333*** | (2006.01) |
| ***G06V 40/13*** | (2022.01) |

(56) References Cited

U.S. PATENT DOCUMENTS

| | | | | |
|---|---|---|---|---|
| 8,193,685 | B2 * | 6/2012 | Klee | B06B 1/0603 310/313 R |
| 10,497,748 | B2 * | 12/2019 | Panchawagh | B06B 1/0207 |
| 2006/0002956 | A1 * | 1/2006 | Surber | A61K 39/02 435/252.33 |
| 2007/0029899 | A1 * | 2/2007 | Matsuzawa | B06B 1/0292 367/181 |
| 2007/0272020 | A1 * | 11/2007 | Schneider | G01N 29/06 73/628 |
| 2008/0231145 | A1 * | 9/2008 | Nagano | B22F 1/107 310/344 |
| 2009/0047445 | A1 * | 2/2009 | Schneider | H10N 30/06 427/562 |
| 2014/0355387 | A1 * | 12/2014 | Kitchens, II | B06B 1/0688 367/137 |
| 2017/0110504 | A1 | 4/2017 | Panchawagh et al. | |

FOREIGN PATENT DOCUMENTS

| | | | | | |
|---|---|---|---|---|---|
| CN | 110008929 | A | | 7/2019 | |
| CN | 110458135 | A | | 11/2019 | |
| CN | 110472606 | A | | 11/2019 | |
| CN | 112633166 | A | * | 4/2021 | G06V 40/1306 |
| CN | 112701149 | A | | 4/2021 | |
| CN | 115274716 | A | | 11/2022 | |
| CN | 115691426 | A | | 2/2023 | |
| CN | 115798434 | A | | 3/2023 | |
| CN | 116637792 | A | | 8/2023 | |
| KR | 20190048252 | A | | 5/2019 | |
| WO | 2020211567 | A1 | | 10/2020 | |
| WO | 2022106637 | A1 | | 5/2022 | |

* cited by examiner

ULTRASONIC TRANSDUCER DEVICE AND DISPLAY APPARATUS

CROSS-REFERENCE TO RELATED APPLICATIONS

The application is a national phase entry under 35 U.S.C § 371 of International Application No. PCT/CN2024/088347, filed on Apr. 17, 2024, which claims the priority of the Chinese patent application No. 202310609058.5, filed with the China National Intellectual Property Administration on May 26, 2023 and named "ULTRASONIC TRANSDUCER DEVICE AND DISPLAY APPARATUS", the entire content of which is incorporated herein by reference.

TECHNICAL FIELD

The disclosure relates to the field of ultrasonic transducer technology, in particular to an ultrasonic transducer device and a display apparatus.

BACKGROUND

A fingerprint is an innate and unchanging feature of the human body that is unique and distinguishable from others, consisting of a series of ridges and valleys on the skin surface at an end of a finger. Details of composition of these ridges and valleys determine the uniqueness of the fingerprint pattern. As a result, display panels with fingerprint identification developed have been used for personal identification, increasing the information security of the display apparatus. Currently, there are various fingerprint identification technologies that have been developed, and ultrasonic fingerprint identification is one of them.

The existing fingerprint identification technologies can be divided into optical fingerprint identification, capacitive fingerprint identification and ultrasonic fingerprint identification according to the working principle. Herein, optical fingerprint identification is strongly affected by external light, and the speed and accuracy of fingerprint identification will decrease under the strong irradiation of external light; and capacitive fingerprint identification cannot accurately determine the dielectric constant of oil and water in a case of oil and dirt on the user's finger, which leads to the decrease of the speed and accuracy of fingerprint identification. Compared with optical fingerprint identification and capacitive fingerprint identification, ultrasonic fingerprint identification technology relies on characteristics of ultrasonic wave with good penetrability, short wavelength and high energy, and can have the high identification speed and identification accuracy in various use situations, including a strong light situation and a situation where fingers have oil or stains.

SUMMARY

Embodiments of the present disclosure provide an ultrasonic transducer device and a display apparatus, and the specific solution is as follows.

Embodiments of the present disclosure provide an ultrasonic transducer device, including a substrate, the substrate includes a plurality of ultrasonic units distributed in an array, and each of the plurality of ultrasonic units includes: a thin film transistor circuit disposed on the substrate; and at least one first ultrasonic transducer, disposed on a side of the thin film transistor circuit facing away from the substrate. The first ultrasonic transducer includes a first electrode, a first vibrating film layer and a second electrode stacked on the side of the thin film transistor circuit facing away from the substrate; a cavity is provided between the first electrode and the first vibrating film layer, the first electrode is electrically connected to the thin film transistor circuit, and the second electrode is electrically connected to a drive voltage line.

In one possible implementation, the ultrasonic transducer device provided by embodiments of the present disclosure further includes a plurality of drive signal lines for loading a drive signal to the thin film transistor circuit. At least two adjacent rows of the ultrasonic units share a same drive signal line, or, at least two adjacent columns of the ultrasonic units share a same drive signal line.

In one possible implementation, in the ultrasonic transducer device provided by embodiments of the present disclosure, the thin film transistor circuit includes: a first transistor, a second transistor, a third transistor, a fourth transistor, and a storage capacitor. The plurality of drive signal lines comprise: a first gate line, a second gate line, a third gate line, a first voltage line, a second voltage line, the drive voltage line, and a signal reading line. A gate of the first transistor is electrically connected to the first gate line, a first pole of the first transistor is electrically connected to the first voltage line, and a second pole of the first transistor is electrically connected to a first pole of the second transistor; a gate of the second transistor is electrically connected to the second gate line, and a second pole of the second transistor is electrically connected to a gate of the third transistor; a first pole of the third transistor is electrically connected to the second voltage line, and a second pole of the third transistor is electrically connected to a first pole of the fourth transistor; a gate of the fourth transistor is electrically connected to the third gate line, and a second pole of the fourth transistor is electrically connected to the signal reading line; a first end of the storage capacitor is electrically connected to the second voltage line, and a second end of the storage capacitor is electrically connected to the gate of the third transistor; and the first electrode of the first ultrasonic transducer is electrically connected to the first pole of the second transistor.

In one possible implementation, in the ultrasonic transducer device provided by embodiments of the present disclosure, every two adjacent columns of the ultrasonic units is a first group, the drive voltage line is provided at a first gap between two columns of the ultrasonic units in the first group, and the second electrodes of the first ultrasonic transducers in two columns of the ultrasonic units in the same first group are electrically connected to the drive voltage line at the first gap.

In one possible implementation, in the ultrasonic transducer device provided by embodiments of the present disclosure, the first gate line spaced from the drive voltage line is further provided at the first gap, and the gates of the first transistors in two columns of the ultrasonic units in the same first group are electrically connected to the first gate line at the first gap.

In one possible implementation, in the ultrasonic transducer device provided by embodiments of the present disclosure, the second voltage line is provided at a second gap between every two adjacent first groups, and the second voltage line is electrically connected to the first poles of all of the third transistors in two columns of the ultrasonic units on both sides of the second voltage line.

In one possible implementation, in the ultrasonic transducer device provided by embodiments of the present disclosure, two adjacent columns of the ultrasonic units in the same first group are arranged symmetrically about the first gap; and the ultrasonic units of two adjacent first groups are arranged symmetrically about the second gap.

In one possible implementation, in the ultrasonic transducer device provided by embodiments of the present disclosure, every two adjacent rows of the ultrasonic units is a second group, the first voltage line is provided at a third gap between two rows of the ultrasonic units in the second group, and the first poles of all of the first transistors in two rows of the ultrasonic units in the same second group are electrically connected to the first voltage line at the third gap.

In one possible implementation, in the ultrasonic transducer device provided by embodiments of the present disclosure, the second gate line is provided at a fourth gap between every two adjacent second groups, and the second gate line is electrically connected to the gates of all of the second transistors in two rows of the ultrasonic units on both sides of the second gate line.

In one possible implementation, in the ultrasonic transducer device provided by embodiments of the present disclosure, two adjacent rows of the ultrasonic units in the same second group are arranged symmetrically about the third gap, and the ultrasonic units of two adjacent second groups are arranged symmetrically about the fourth gap.

In one possible implementation, in the ultrasonic transducer device provided by embodiments of the present disclosure, a quantity of the first ultrasonic transducers in each of the plurality of ultrasonic units is one or two; and an orthographic projection of each of the first ultrasonic transducers on the substrate does not overlap with orthographic projections of the thin film transistor circuit and the signal lines on the substrate.

In one possible implementation, in the ultrasonic transducer device provided by embodiments of the present disclosure, a quantity of the first ultrasonic transducers in each of the plurality of ultrasonic units is three; and an orthographic projection of each of the first ultrasonic transducers on the substrate overlaps with orthographic projections of the thin film transistor circuit and other signal line on the substrate.

In one possible implementation, in the ultrasonic transducer device provided by embodiments of the present disclosure, a quantity of the first ultrasonic transducers in the ultrasonic unit is greater than or equal to two, the first electrodes of the first ultrasonic transducers in the same ultrasonic unit are a one-piece structure, the second electrodes of the first ultrasonic transducers in the same ultrasonic unit are a one-piece structure, and the cavities of the first ultrasonic transducers in the same ultrasonic unit are separated from each other by the first vibrating film layer.

In one possible implementation, in the ultrasonic transducer device provided by embodiments of the present disclosure, a width-to-length ratio of the third transistor is greater than or equal to a width-to-length ratio of the fourth transistor.

In one possible implementation, in the ultrasonic transducer device provided by embodiments of the present disclosure, at least one of the first transistor, the second transistor, the third transistor and the fourth transistor is a double-gate transistor.

In one possible implementation, in the ultrasonic transducer device provided by embodiments of the present disclosure, an active layer of the third transistor and an active layer of the fourth transistor are a one-piece structure, the second pole of the third transistor and the first pole of the fourth transistor are a one-piece structure, and the second pole of the third transistor is electrically connected to the active layer of the third transistor.

In one possible implementation, in the ultrasonic transducer device provided by embodiments of the present disclosure, the substrate further includes a virtual ultrasonic unit disposed on an outer side of the plurality of ultrasonic units distributed in an array; the virtual ultrasonic unit includes the thin film transistor circuit and a second ultrasonic transducer; the second ultrasonic transducer includes a third electrode, a second vibrating film layer and a fourth transistor stacked on the side of the thin film transistor circuit facing away from the substrate; a sacrificial layer is provided between the third electrode and the second vibrating film layer, the third electrode is electrically connected to the thin film transistor circuit, and the fourth electrode is electrically connected to the drive voltage line.

Correspondingly, embodiments of the present disclosure further provide a display apparatus, including a display panel and the ultrasonic transducer device provided by the embodiments of the present disclosure.

In one possible implementation, in the display apparatus provided by embodiments of the present disclosure, the display panel is a liquid crystal display panel, and each of the plurality of the ultrasonic units in the ultrasonic transducer device is disposed in a non-light-emitting region in the liquid crystal display panel.

In one possible implementation, in the display apparatus provided by embodiments of the present disclosure, the display panel is an organic light-emitting display panel, and the ultrasonic transducer device is disposed at a back of the organic light-emitting display panel.

DETAILED DESCRIPTION

In order to make the objectives, technical solutions and advantages of embodiments of the present disclosure clearer, the technical solutions of embodiments of the present disclosure will be described clearly and completely in the following in conjunction with the accompanying drawings of embodiments of the present disclosure. Obviously, the described embodiments are a part of embodiments of the present disclosure, and not all of the embodiments. And embodiments and the features in the embodiments of the present disclosure can be combined with each other without conflict. Based on the described embodiments of the present disclosure, all other embodiments obtained by a person of ordinary skill in the art without the creative labor are within the scope of protection of the present disclosure.

Unless otherwise defined, technical terms or scientific terms used in the present disclosure shall have the ordinary meaning understood by a person of ordinary skill in the field to which the present disclosure belongs. The words “including” or “comprising” and the like as used in the present disclosure are intended to mean that the element or object appearing before the word covers the element or object appearing after the word and its equivalents, without excluding other elements or objects. Words such as “connected” or “coupled” are not limited to physical or mechanical connections, but may include electrical connections, whether direct or indirect. The words “inside”, “outside”, “above”, “below”, etc., are used only to indicate relative positional relationships. When the absolute position of the depicted object is changed, the relative positional relationship may also be changed accordingly.

It should be noted that dimensions and shapes of figures in the accompanying drawings do not reflect true proportions and are intended to illustrate the present disclosure only. And throughout the same or similar labeling denotes the same or similar elements or elements having the same or similar function.

In the related technology, the most commonly used ultrasonic fingerprint identification is Poly-vinylidene Fluoride (PVDF) ultrasonic fingerprint identification, which is not interfered by the external light and does not require a display to provide a light source, can realize 3D fingerprints and skin deep information detection, with a strong anti-counterfeiting ability. But the technology is monopolized by Qualcomm, and it requires a special material of PVDF and a special polarization device, resulting in the high cost.

Figure 1:
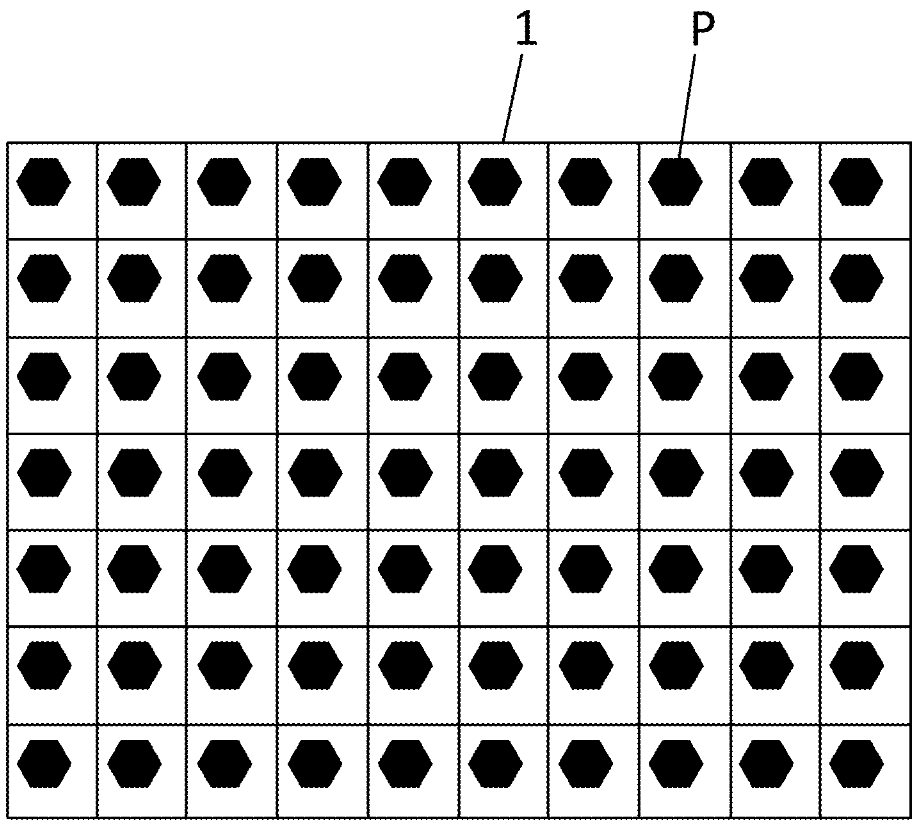
FIG. 1 shows a schematic diagram of a planar structure of an ultrasonic transducer device provided by embodiments of the present disclosure.
Figure 2:
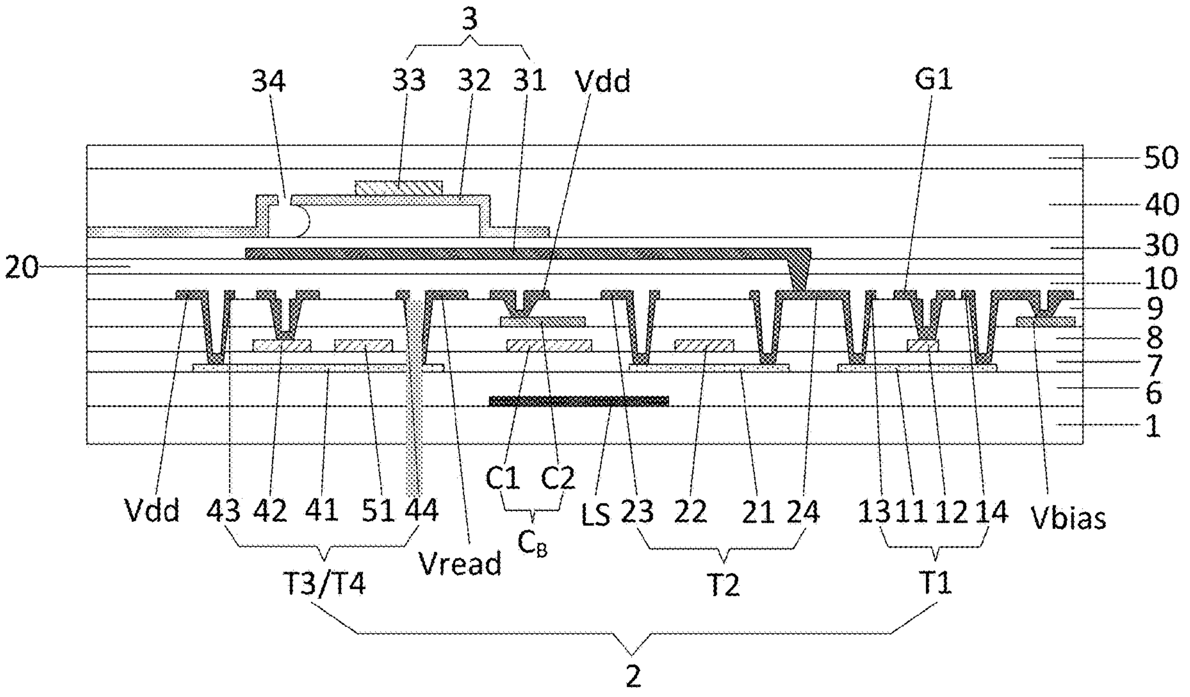
FIG. 2 shows a schematic diagram of a cross-section of one of ultrasonic units in FIG. 1.

In view of this, embodiments of the present disclosure provide an ultrasonic transducer device, as shown in FIG. 1, including a substrate 1, and the substrate 1 includes a plurality of ultrasonic units P distributed in an array. As shown in FIG. 2, which shows a schematic diagram of a cross-section of one of the ultrasonic units P in FIG. 1, each of the ultrasonic units P includes:

a thin film transistor circuit 2, disposed on the substrate 1; and at least one first ultrasonic transducer 3, disposed on a side of the thin film transistor circuit 2 facing away from the substrate 1; where the first ultrasonic transducer 3 includes a first electrode 31, a first vibrating film layer 32, and a second electrode 33 stacked on a side of the thin film transistor circuit 2 facing away from the substrate 1; a cavity 34 is provided between the first electrode 31 and the first vibrating film layer 32; the first electrode 31 is electrically connected to the thin film transistor circuit 2; and the second electrode 33 is electrically connected to a drive voltage line.

The above-described ultrasonic transducer (capacitive micromachined ultrasonic transducer, CMUT) device provided by embodiments of the present disclosure can perform fingerprint identification by combining the thin film transistor circuit with the ultrasonic transducer to form a large-area and arrayed ultrasonic fingerprint identification structure, with a simple structure and a high identification accuracy.

Specifically, the main function of the CMUT is: in a transmitting phase, under the action of an excitation signal, the transducer converts the input electrical energy into mechanical energy to be transmitted, realizing the transmitting of ultrasonic waves; and in a receiving phase, the transducer converts the acoustic wave into an electrical signal, realizing the receiving of ultrasonic waves. Therefore, the ultrasonic units in the ultrasonic transducer (CMUT) device in the embodiments of the present disclosure can be combined with a display panel, and when a user touches the display panel, the ultrasonic waves are transmitted to the finger of the person; and due to different reflection intensities of the ultrasonic signal by the ridges and valleys of the finger surface, the energy of the ultrasonic waves reflected by the ridges and valleys of the finger is different. The difference in the energy is converted into the difference in electrical signals, and it is possible to carry out imaging of the ridges and valleys of the fingerprint, thus performing fingerprint identification.

Optionally, a material of the first vibrating film layer may be Polyimide (PI) or Polyethylene terephthalate (PET), etc.

Optionally, the substrate may be a rigid substrate, such as a glass substrate; or the substrate may be a flexible substrate, such as PI.

The ultrasonic transducer provided by embodiments of the present disclosure is fabricated using a glass substrate or a flexible PI substrate, which can have a larger area and can also be flexibly adhered to the surface of the human body and objects, with an advantage far beyond that of silicon-based CMUT devices.

Figure 3:
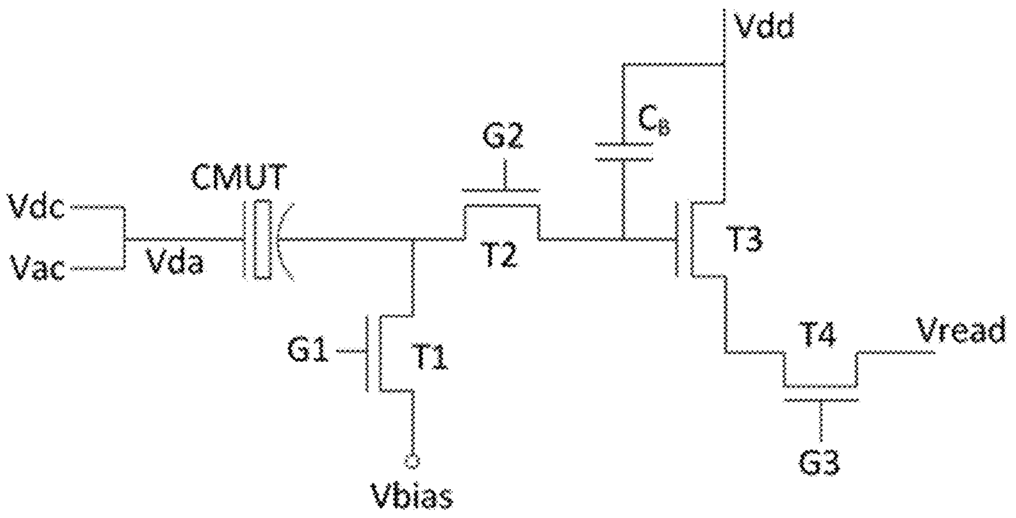
FIG. 3 shows a schematic diagram of a specific circuit of a thin film transistor circuit.

In a specific implementation, in the above-described ultrasonic transducer device provided in embodiments of the present disclosure, as shown in FIGS. 2 and 3, the thin film transistor circuit includes: a first transistor T1, a second transistor T2, a third transistor T3, a fourth transistor T4, and a storage capacitor $C_B$. A gate of the first transistor T1 is electrically connected to a first gate line G1, a first pole of the first transistor T1 is electrically connected to a first voltage line Vbias, and a second pole of the first transistor T1 is electrically connected to a first pole of the second transistor T2. A gate of the second transistor T2 is electrically connected to a second gate line G2, and a second pole of the second transistor T2 is electrically connected to a gate of the third transistor T3. A first pole of the third transistor T3 is electrically connected to a second voltage line Vdd, and a second pole of the third transistor T3 is electrically connected to a first pole of the fourth transistor T4. A gate of the fourth transistor T4 is electrically connected to the third gate line G3, and a second pole of the fourth transistor T4 is electrically connected to a signal reading line Vread. A first end of the storage capacitor $C_B$ is electrically connected to the second voltage line Vdd, and a second end of the storage capacitor $C_B$ is electrically connected to the gate of the third transistor T3. A first electrode of the first ultrasonic transducer 3 is electrically connected to the first pole of the second transistor T2, and a second electrode 33 of the first ultrasonic transducer 3 is electrically connected to the drive voltage line Vda; where Vda is used for inputting a direct current voltage Vdc and an alternating current voltage Vda to the second electrode 33.

It should be noted that the thin film transistor circuit shown in FIG. 3 is only one of circuit structures in the embodiments of the present disclosure, and the thin film transistor circuits in the embodiments of the present disclosure are not limited to the structure shown in FIG. 3. Other circuits capable of realizing ultrasonic fingerprint identification in conjunction with the first ultrasonic transducer are within the scope of the protection of the embodiments of the present disclosure.

As shown in FIG. 2, the first transistor T1 includes a first active layer 11, a first gate 12, a first source 13 and a first drain 14 sequentially stacked between the substrate 1 and the first ultrasonic transducer 3; the second transistor T2 includes a second active layer 21, a second gate 22, a second source 23 and a second drain 24 sequentially stacked between the substrate 1 and the first ultrasonic transducer 3; the third transistor T3 includes a third active layer 41, a third gate 42, a third source 43 and a third drain 44 sequentially stacked between the substrate 1 and the first ultrasonic transducer 3; and the fourth transistor T4 includes a third active layer 41, a fourth gate 51, a third source 43 and a third drain 44 sequentially stacked between the substrate 1 and the first ultrasonic transducer 3. That is, the fourth transistor T4 may share the active layer, the source and the drain with the third transistor T3. Herein, the first active layer 11, the second active layer 21 and the third active layer 41 are disposed in the same film layer (active layer); the first gate 12, the second gate 22, the third gate 42 and the fourth gate 51 are disposed in the same film layer (Gate1 layer); the first pole plate C1 of the storage capacitor CB is disposed in the Gate1 layer; the second pole plate C2 of the storage capacitor CB is disposed in the Gate2 layer; and the first source 13, the first drain 14, the second source 23, the second drain 24, the third source 43 and the third drain 44 are disposed in the same film layer (SD layer).

Specifically, the first pole of each transistor in FIG. 3 may be a source and the second pole may be a drain. Of course, the first pole of each transistor in FIG. 3 may be a drain and the second pole may be a source.

As shown in FIG. 2, a shading layer LS is further disposed between the substrate 1 and the active layer, and the shading layer LS can be used for shading the active layer, or can be used for replacing the Gate1 layer to form a storage capacitor $C_B$ with the Gate2 layer (the present disclosure is illustrated herein). A first buffer layer 6 is further disposed between the shading layer LS and the active layer, a first gate insulating layer 7 is further disposed between the active layer and the Gate1 layer, a second gate insulating layer 8 is further disposed between the Gate1 layer and the Gate2 layer, an interlayer insulating layer 9 is further disposed between the Gate2 layer and the SD layer, a flat layer 10 is further disposed between the SD layer and the first ultrasonic transducer 3, and a first passivation layer 20 is further disposed between the flat layer 10 and the first ultrasonic transducer 3. The first electrode 31 of the first ultrasonic transducer 3 is electrically connected to the first pole (second drain 24) of the second transistor T2 through a via hole running through the first passivation layer 20 and the flat layer 10, a second passivation layer 30 is further disposed between the first electrode 31 and the cavity 34, a second buffer layer 40 is further disposed above the second electrode 33, and a third buffer layer 50 is further disposed above the second buffer layer 40.

Of course, other essential components of the ultrasonic transducer device are understood by those of ordinary skill in the art and will not be repeated herein.

Specifically, as shown in FIG. 2, the cavity 34 can be fabricated by using a sacrificial layer, with an etching hole 35 of the sacrificial layer. The sacrificial layer is fabricated in the same manner as in the prior art, which will not be described in detail herein.

Figure 4:
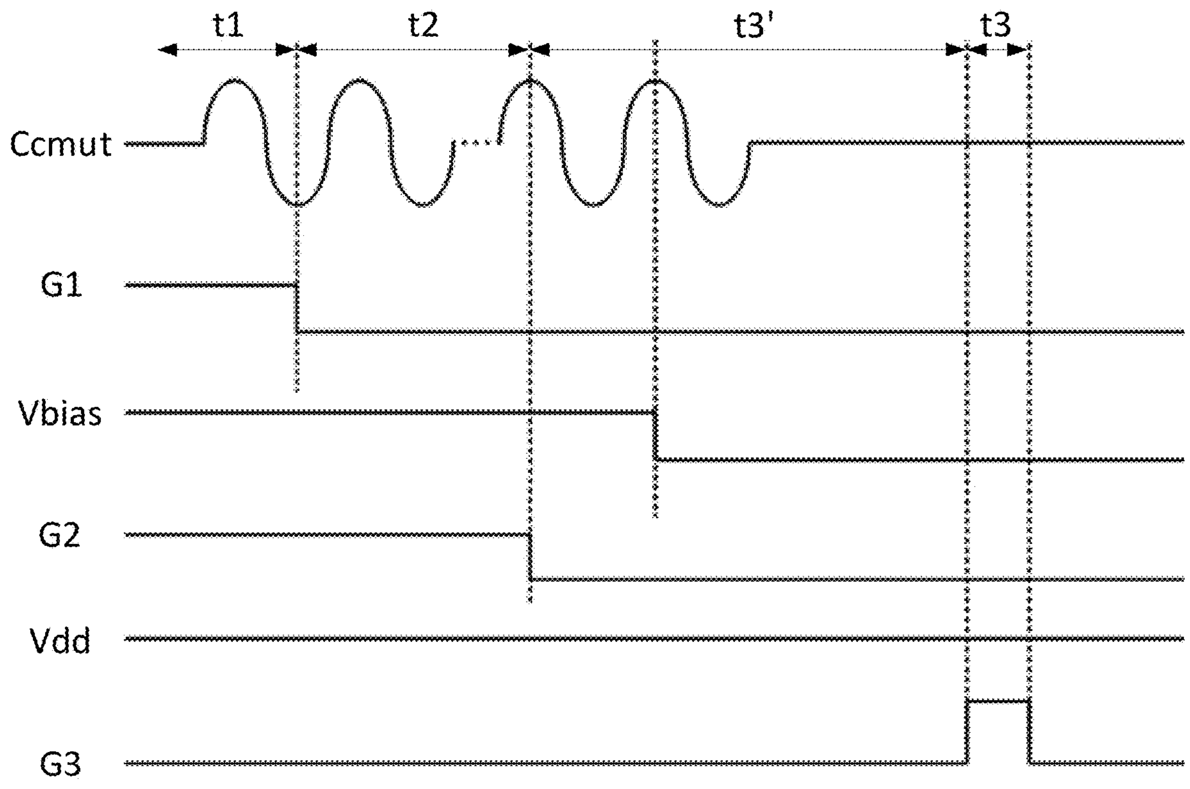
FIG. 4 shows a schematic diagram of an operating timing sequence of the thin film transistor circuit shown in FIG. 3.

The principle of the above ultrasonic transducer device provided in the embodiments of the present disclosure for realizing fingerprint identification is explained below in conjunction with the thin film transistor circuit shown in FIG. 3 and the timing sequence shown in FIG. 4, as follows.

In the t1 stage (transmitting stage of ultrasonic waves), the second electrode of the CMUT is supplied with both a direct current (DC) voltage Vdc and an alternating current (AC) voltage Vac, the first transistor T1 and the second transistor T2 are turned on, the first voltage line Vbias is at a constant potential, and the first vibrating film layer of the CMUT vibrates at a high frequency to emit sound waves.

In the t2 stage (acquisition stage), a left end of the CMUT only needs to be supplied with a DC voltage Vdc, and the AC voltage Vac is not required; the first transistor T1 is turned off, and the second transistor T2 is turned on; the external acoustic signal reaches the CMUT through reflection of the finger and presses the first vibrating film layer to produce vibration, to generate the AC current (charge); and the AC amplitudes during the half-cycle are collected, and the charge is stored in the storage capacitor CB.

In the t3 stage (reading stage), the third transistor T3 and the fourth transistor T4 are turned on, the charge stored in the storage capacitor CB is converted into the current via the third transistor T3, which is finally outputted by the fourth transistor T4, and the output current is read through the signal reading line Vread, realizing fingerprint identification.

In specific implementations, after the charge is collected in the t2 stage, reading in the t3 stage may not be performed directly, i.e., there may also be a buffer stage t3' between the t2 stage and the t3 stage. The t3 stage may be performed when reading is required; and in the t3' stage, the voltage on the first voltage line Vbias may be pulled down to reduce the power consumption.

In specific implementations, in the above ultrasonic transducer device provided in embodiments of the present disclosure, as shown in FIG. 3 and FIGS. 5-8, which are schematic diagrams of a layout corresponding to several ultrasonic units P in FIG. 1 respectively, the ultrasonic transducer device includes a plurality of drive signal lines for loading drive signals to the thin film transistor circuits; and the drive signal lines include a first gate line G1, a second gate line G2, a third gate line G3, a first voltage line Vbias, a second voltage line Vdd, a drive voltage line Vda, and a signal reading line Vread. At least two adjacent rows of ultrasonic units P share the same drive signal line (e.g., share Vbias), or, at least two adjacent columns of ultrasonic units P share the same drive signal line (e.g., share Vbias). This can save space, simplify the design, and facilitate the design of high resolution.

Specifically, as shown in FIGS. 2 and 3, the first gate line G1, the second voltage line Vdd, and the signal reading line Vread may be located in the SD layer; the second gate line G2 and the third gate line G3 may be located in the Gate1 layer; the first voltage line Vbias may be located in the Gate2 layer; and the drive voltage line Vda and the second electrode 33 are located in the same layer.

Figure 5:
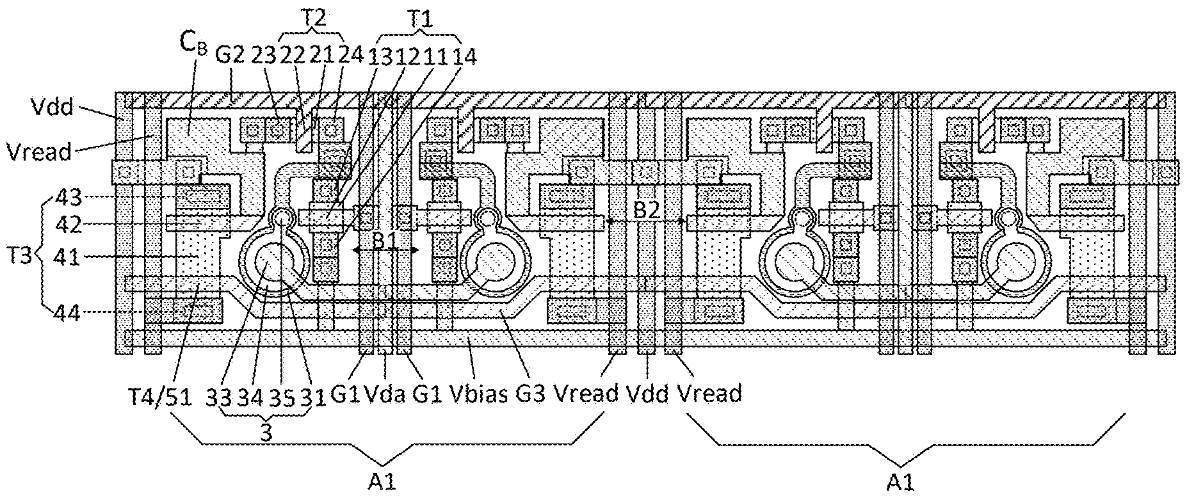
FIG. 5 shows a schematic diagram of one layout corresponding to several ultrasonic units in FIG. 1.

In specific implementations, in the above ultrasonic transducer device provided in embodiments of the present disclosure, as shown in FIG. 5, every two adjacent columns of ultrasonic units P is a first group A1, one drive voltage line Vda is disposed at a first gap B1 between two columns of ultrasonic units P in the first group A1, and second electrodes 33 of the first ultrasonic transducers 3 in two columns of ultrasonic units P in the same first group A1 are all electrically connected to the drive voltage line Vda at the first gap B1. In this way, two adjacent columns of ultrasonic units P share one drive voltage line Vda, which can save space, simplify the design, and facilitate the design of high resolution.

Figure 6:
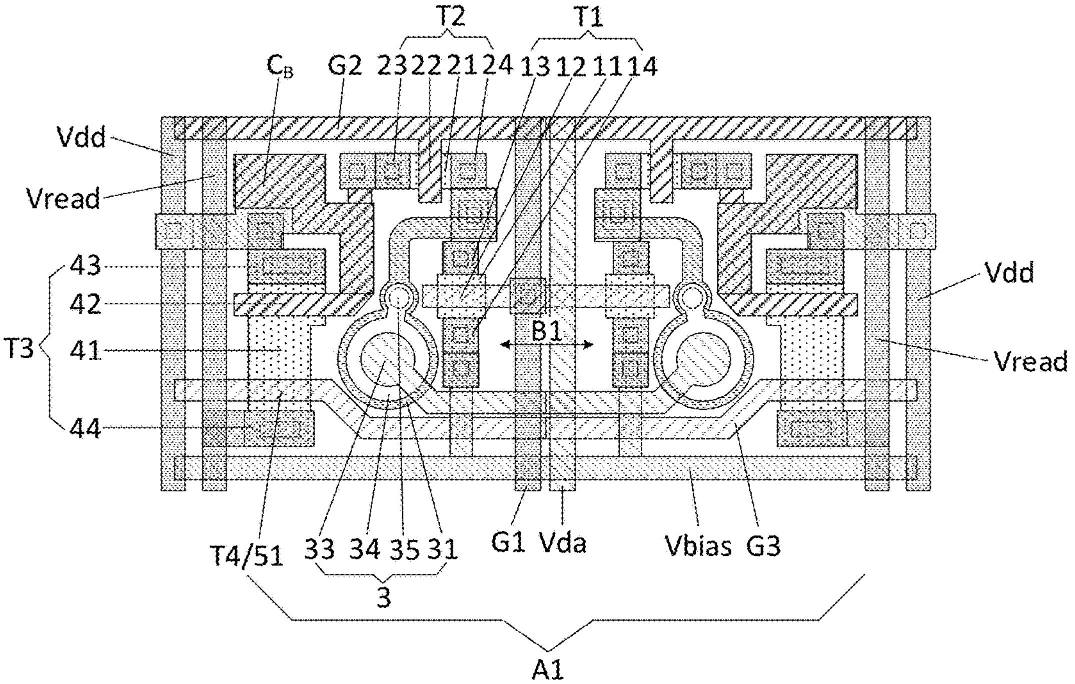
FIG. 6 shows a schematic diagram of another layout corresponding to several ultrasonic units in FIG. 1.

In specific implementations, in the above ultrasonic transducer device provided in embodiments of the present disclosure, as shown in FIG. 6, a first gate line G1 spaced apart from the drive voltage line Vda is further disposed at the first gap B1, and gates of the first transistors T1 in two columns of ultrasonic units P in the same first group A1 are all electrically connected to the first gate line G1 at the first gap B1. In this way, two adjacent columns of ultrasonic units P share one first gate line G1, which can further save space, further simplify the design, and further facilitate the design of high resolution.

In specific implementations, in the above ultrasonic transducer device provided in embodiments of the present disclosure, as shown in FIG. 5, one second voltage line Vdd is disposed at a second gap B2 between every two adjacent first groups (A1) P, and the second voltage line Vdd is electrically connected to first poles of all the third transistors T3 in two columns of ultrasonic units P on both sides of the second voltage line Vdd. In this way, two adjacent columns of ultrasonic units P share one second voltage line Vdd, which can further save space, further simplify the design, and further facilitate the design of high resolution.

In specific implementations, in the above ultrasonic transducer device provided by embodiments of the present disclosure, as shown in FIGS. 5 and 6, two adjacent columns of ultrasonic units P in the same first group A1 are symmetrically disposed about the first gap B1, and ultrasonic units P in two adjacent first groups (A1) are symmetrically disposed about the second gap B2. In this way, two adjacent left and right ultrasonic units P are mirror symmetry structures, and a size of each ultrasonic unit P may be 75 micrometers*75 micrometers, but of course is not limited to this.

Figure 7:
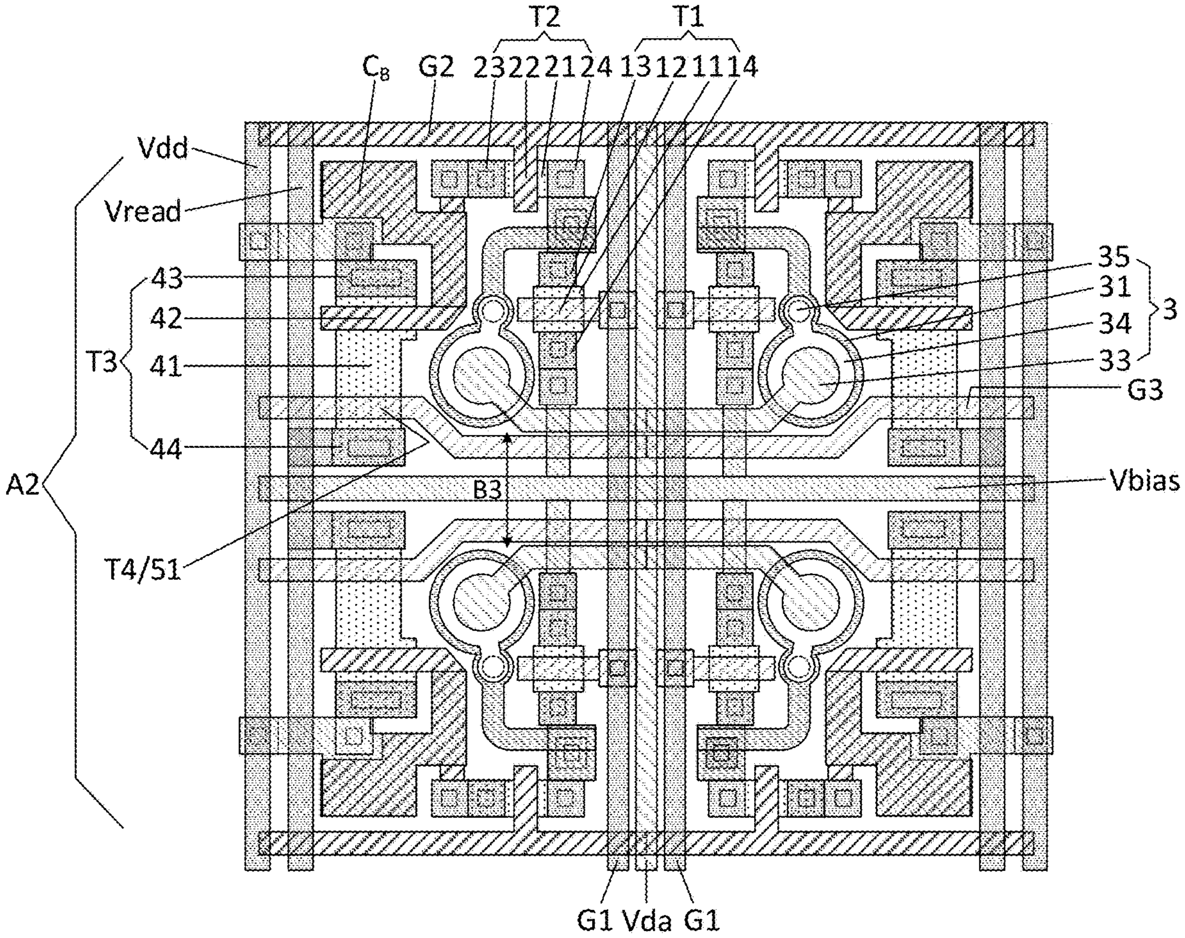
FIG. 7 shows a schematic diagram of another layout corresponding to several ultrasonic units in FIG. 1.

In specific implementations, in the above ultrasonic transducer device provided in embodiments of the present disclosure, as shown in FIG. 7, every two adjacent rows of ultrasonic units P is a second group A2, one first voltage line Vbias is disposed at a third gap B3 between two rows of ultrasonic units P in the second group A2, and first poles of all the first transistors T1 in two rows of ultrasonic units P in the same second group A2 are all electrically connected the first voltage line Vbias at the third gap B3. In this way, two adjacent rows of ultrasonic units P share one first voltage line Vbias, which can further save space, further simplify the design, and further facilitate the design of high resolution.

Figure 8:
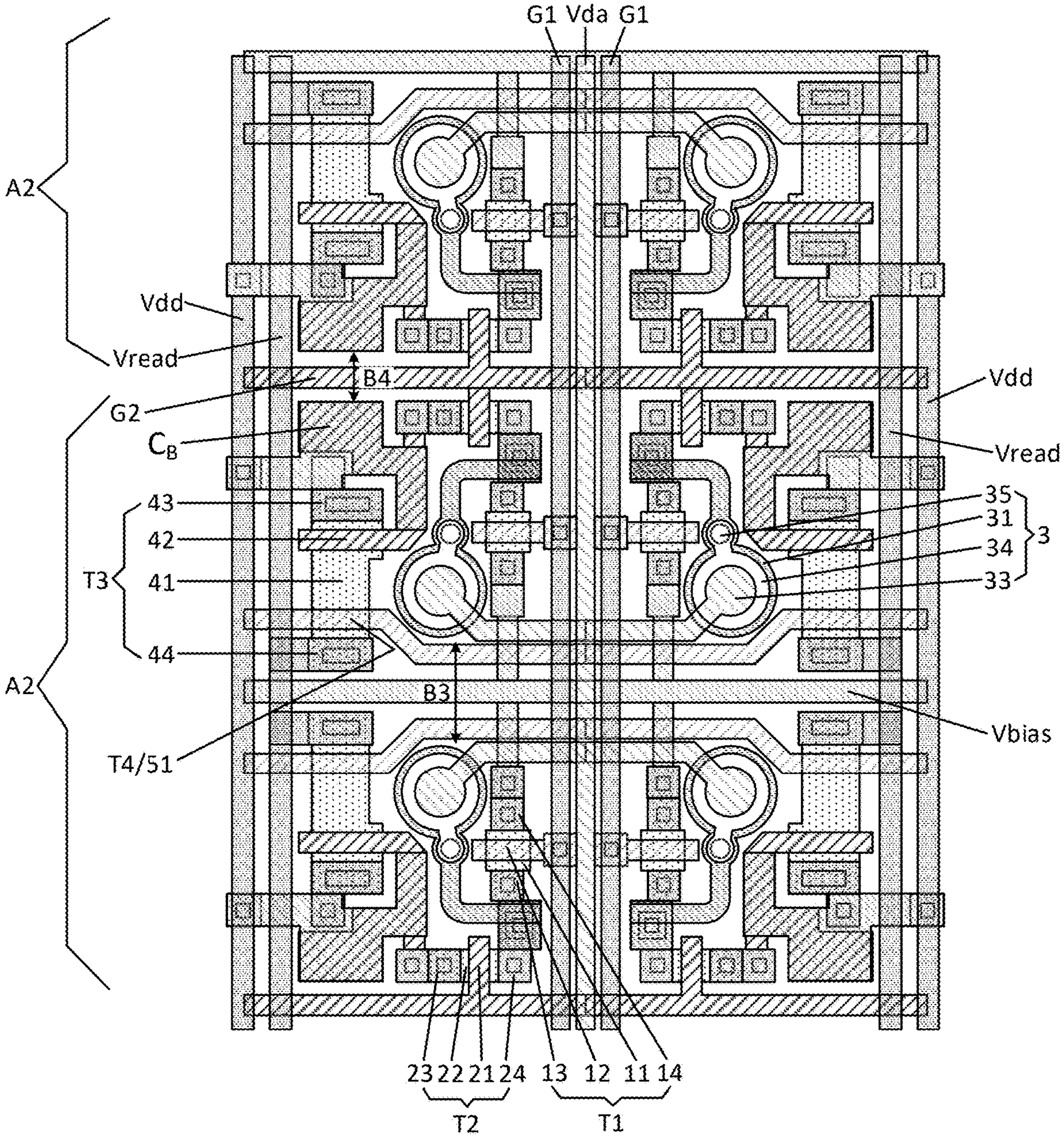
FIG. 8 shows a schematic diagram of another layout corresponding to several ultrasonic units in FIG. 1.

In specific implementations, in the above-described ultrasonic transducer device provided in embodiments of the present disclosure, as shown in FIG. 8, one second gate line G2 is disposed at a fourth gap B4 between every two adjacent second groups (A2), and the second gate line G2 is electrically connected to gates of all the second transistors T2 in two rows of ultrasonic units P on both sides of the second gate line G2. In this way, two adjacent rows of ultrasonic units P share one second gate line G2, which can further save space, further simplify the design, and facilitate further high-resolution design.

In specific implementations, in the above ultrasonic transducer device provided by embodiments of the present disclosure, as shown in FIGS. 7 and 8, two adjacent rows of ultrasonic units P in the same second group A2 are symmetrically disposed about the third gap B3, and ultrasonic units P in two adjacent second groups (A2) are symmetrically disposed about the fourth gap B4. In this way, four adjacent ultrasonic units P in upper, lower, left and right directions are mirror symmetry structures, and a size of each ultrasonic unit P may be 75 micrometers*75 micrometers, but of course is not limited to this.

Specifically, as shown in FIGS. 5-8, FIG. 5 is an example of two adjacent columns of ultrasonic units P sharing one drive voltage line Vda and two adjacent columns of ultrasonic units P sharing one second voltage line Vdd, FIG. 6 is an example of two adjacent columns of ultrasonic units P sharing one first gate line G1 on the basis of FIG. 5, FIG. 7 is an example of two adjacent rows of ultrasonic units P sharing one first voltage line Vbias, and FIG. 8 is an example of two adjacent rows of ultrasonic units P sharing one first voltage line Vbias and two adjacent rows of ultrasonic units P sharing one second gate line G2 on the basis of FIG. 5. In specific implementations, the above-described ultrasonic transducer device provided by the embodiments of the present disclosure may simultaneously adopt Vda sharing, Vdd sharing, G1 sharing, Vbias sharing, G2 sharing, and of course, may choose to adopt one or more signal lines sharing.

Figure 9:
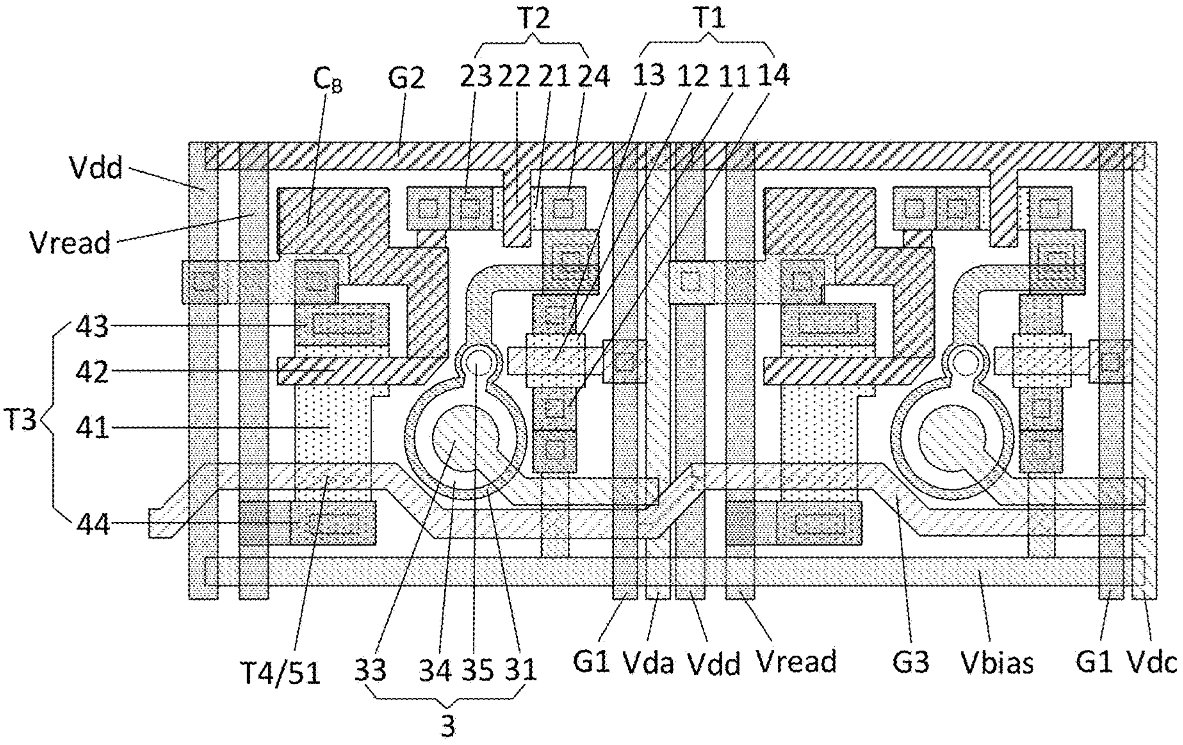
FIG. 9 shows a schematic diagram of another layout corresponding to several ultrasonic units in FIG. 1.

In specific implementations, in the above-described ultrasonic transducer device provided in the embodiments of the present disclosure, for the case where there is sufficient wiring space, each of the above-described shared signal lines may also not be shared. As shown in FIG. 9, a gap between the ultrasonic units contains a complete set of all signal lines.

In specific implementations, in the above-described ultrasonic transducer device provided in embodiments of the present disclosure, as shown in FIG. 2 and FIGS. 5-8, the number of the first ultrasonic transducer 3 in each ultrasonic unit P is 1, and an orthographic projection of each of the first ultrasonic transducers 3 on the substrate 1 does not overlap with orthographic projections of the thin film transistor circuits 2 and each of the signal lines (e.g., Vda, Vdd, G1, Vbias, and G2) on the substrate 1. This can reduce the overlapping capacitance (parasitic capacitance), thereby improving the conversion performance between the mechanical energy and the electrical energy of the first ultrasonic transducer 3.

Figure 10:
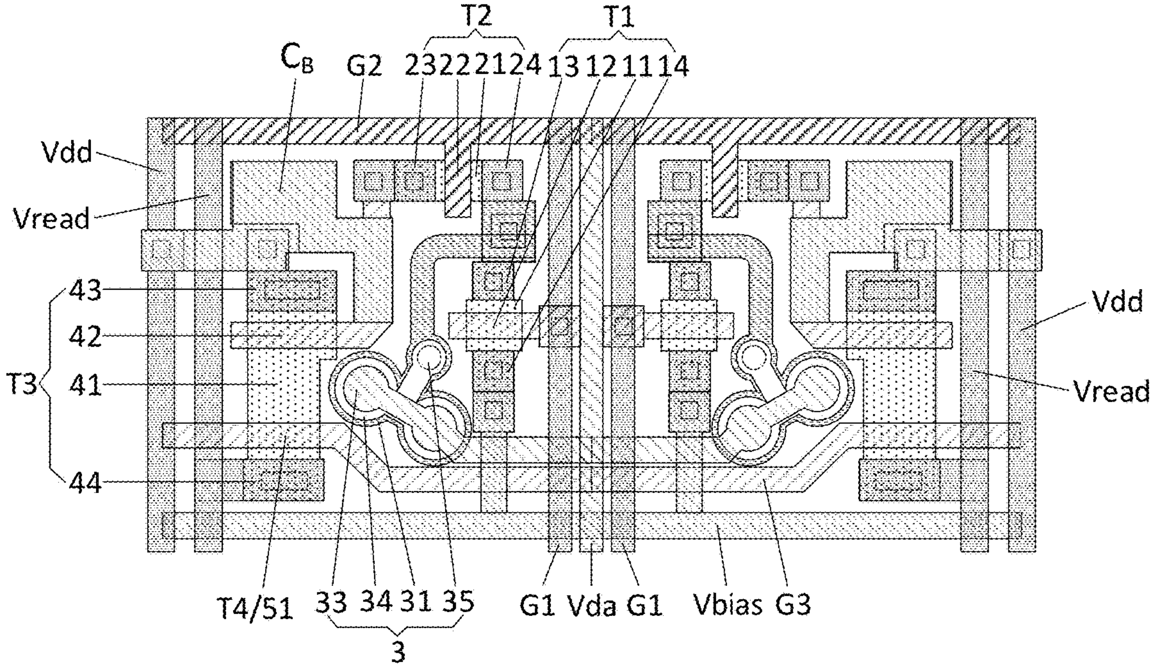
FIG. 10 shows a schematic diagram of another layout corresponding to several ultrasonic units in FIG. 1.

In specific implementations, in the above ultrasonic transducer device provided in the embodiments of the present disclosure, as shown in FIG. 10, the number of the first ultrasonic transducers 3 in each ultrasonic unit P is 2, and an orthographic projection of each of the first ultrasonic transducers 3 on the substrate 1 does not overlap with orthographic projections of the thin film transistor circuits 2 and each of the signal lines (e.g., Vda, Vdd, G1, Vbias, and G2)

on the substrate 1. On one hand, this can reduce the overlapping capacitance (parasitic capacitance) and improve the conversion performance between the mechanical energy and the electrical energy of the first ultrasonic transducer 3; and on the other hand, two first ultrasonic transducers 3 are conducive to improving the emitted acoustic pressure and the signal reception sensitivity.

Figure 11:
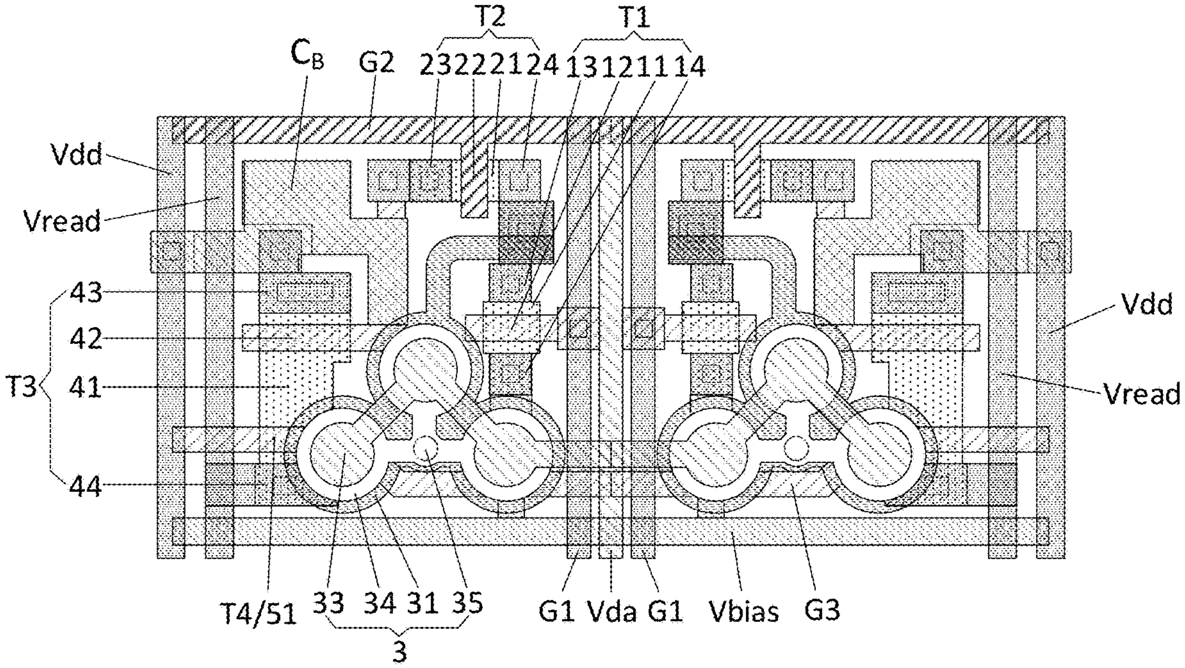
FIG. 11 shows a schematic diagram of another layout corresponding to several ultrasonic units in FIG. 1.

In specific implementations, in the above-described ultrasonic transducer device provided in the embodiments of the present disclosure, as shown in FIG. 11, the number of the first ultrasonic transducers 3 in each ultrasonic unit P is 3, and an orthographic projection of each first ultrasonic transducer 3 on the substrate 1 overlaps with orthographic projections of the thin film transistor circuits 2 and other signal lines (e.g., G3 and the like) on the substrate 1. This can ensure that the overlapping capacitance is within an acceptable range, and arranging three first ultrasonic transducers 3 is conducive to further improving the emitted acoustic pressure and the signal reception sensitivity. Thus, one, two or three first ultrasonic transducers 3 can be designed as desired.

In specific implementations, in the above-described ultrasonic transducer device provided in embodiments of the present disclosure, structures shown in FIG. 10 and FIG. 11 may simultaneously adopt the above-described scheme of sharing respective signal lines.

In specific implementations, in the above-described ultrasonic transducer device provided in the embodiments of the present disclosure, as shown in FIGS. 10 and 11, when the number of the first ultrasonic transducers 3 in the ultrasonic unit P is greater than or equal to two, first electrodes 31 of respective first ultrasonic transducers 3 in the same ultrasonic unit P is a one-piece structure, second electrodes 33 of respective first ultrasonic transducers 3 in the same ultrasonic unit P is a one-piece structure, and cavities 34 of respective first ultrasonic transducers 3 in the same ultrasonic unit P are separated from each other by the first vibrating film layer 32. In this way, during fabrication, the first electrode 31 can be firstly fabricated as a one-piece structure, a second passivation layer 30 is formed on the first electrode 31, a sacrificial layer is formed on the second passivation layer 30, the sacrificial layer is patterned so that the sacrificial layer corresponds to two or three cavity patterns to be formed, a first vibrating film layer 32 is formed on the sacrificial layer, an etching hole 35 of the sacrificial layer is fabricated in the first vibrating film layer 32 at the connection point of three cavity structures, and the sacrificial layer is removed at the etching hole 35 of the sacrificial layer.

In specific implementations, in the above ultrasonic transducer device provided in embodiments of the present disclosure, as shown in FIGS. 2 and FIGS. 5-11, the first transistor T1, the second transistor T2, the third transistor T3 and the fourth transistor T4 may all be of different thin film transistor (TFT) structures and sizes according to the actual needs. For example, a low temperature polycrystalline oxide (LTPO) process is used, where the second transistor T2 may be an Oxide TFT to reduce the leakage current $I_{off}$ and reduce the loss of charge stored in the storage capacitor $C_B$, to stabilize the gate potential of the third transistor T3.

Figure 12:
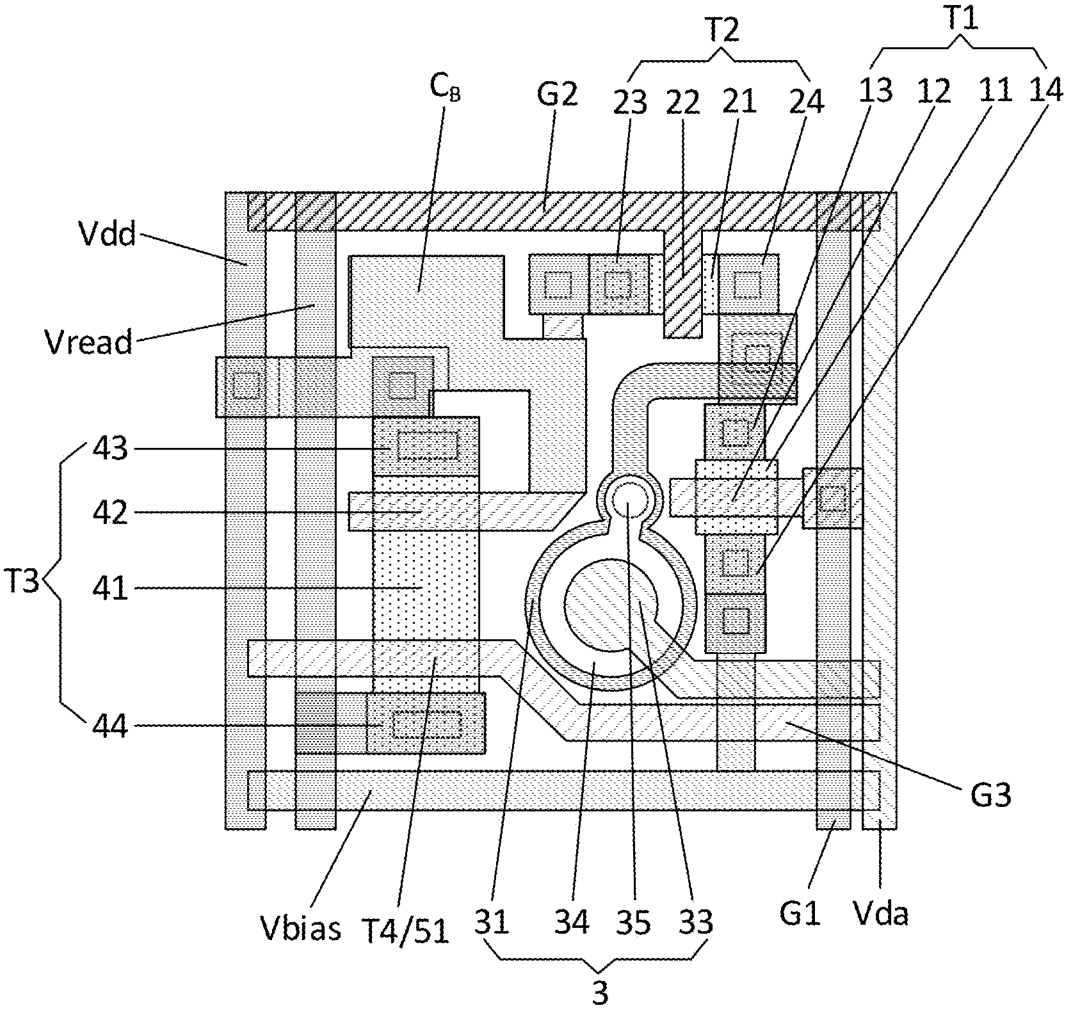
FIG. 12 shows a schematic diagram of another layout corresponding to several ultrasonic units in FIG. 1.

In specific implementations, in the above ultrasonic transducer device provided in embodiments of the present disclosure, as shown in FIG. 12, a width-to-length ratio of the third transistor T3 is equal to a width-to-length ratio of the fourth transistor T4. Of course, it is also possible that the width-to-length ratio of the third transistor T3 is greater than the width-to-length ratio of the fourth transistor T4, so that the efficiency of converting the voltage to the current can be improved.

Figure 13:
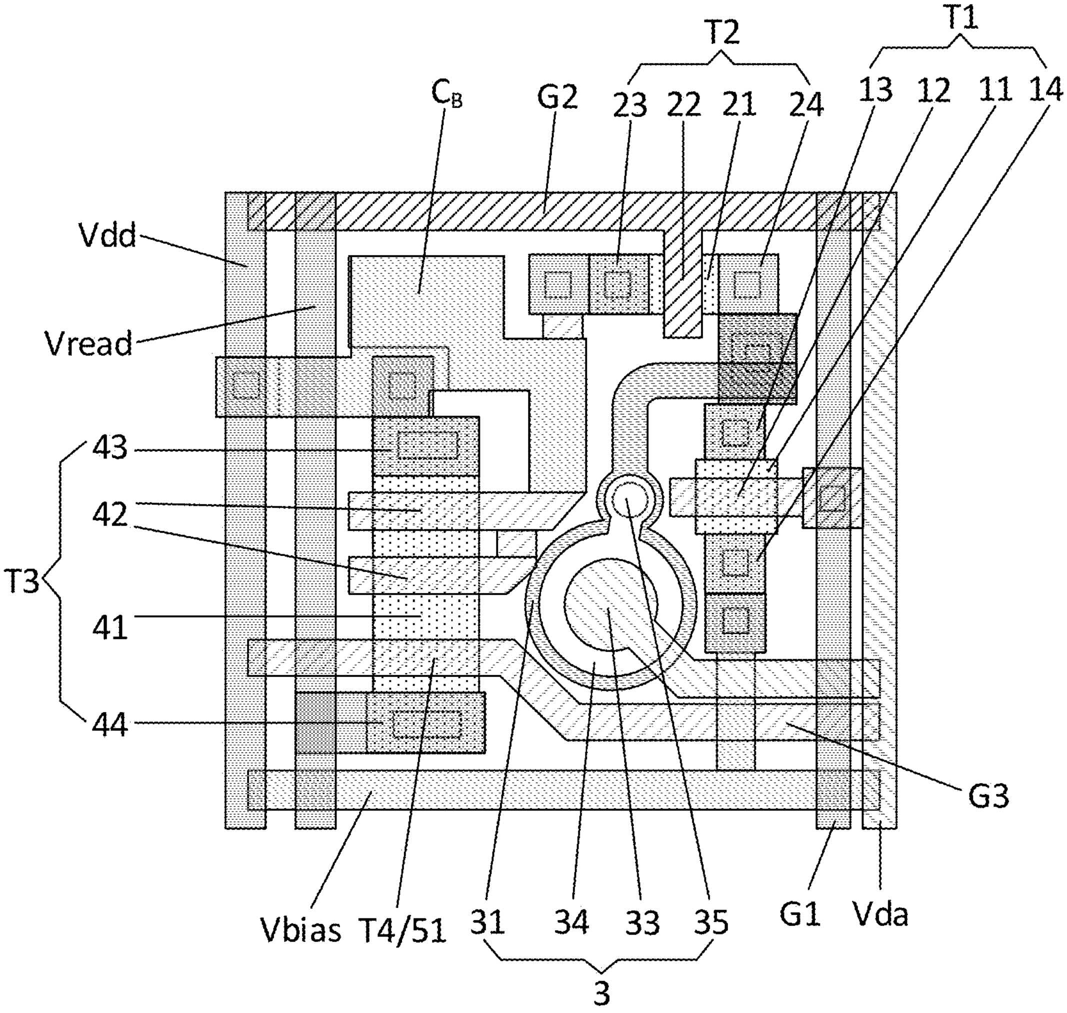
FIG. 13 shows a schematic diagram of another layout corresponding to several ultrasonic units in FIG. 1.

In specific implementations, in the above-described ultrasonic transducer device provided in embodiments of the present disclosure, as shown in FIG. 13, at least one of the first transistor T1, the second transistor T2, the third transistor T3 and the fourth transistor T4 is a double gate transistor. FIG. 13 shows an example of a third transistor T3 as a double-gate transistor, so that, on one hand, the leakage current can be reduced; and on the other hand, the homogeneity of film layers between the transistors can be improved to reduce the difference between the transistors.

Figure 14:
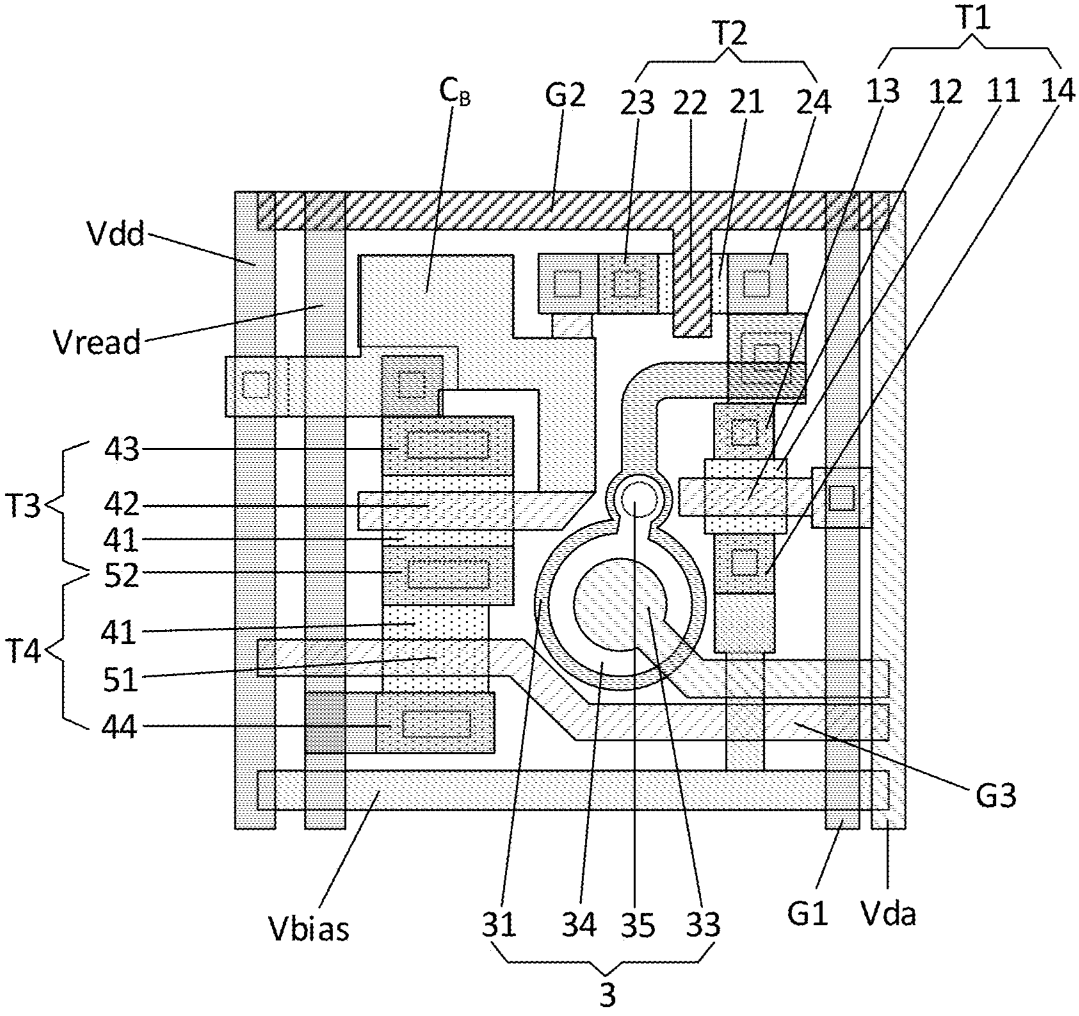
FIG. 14 shows a schematic diagram of another layout corresponding to several ultrasonic units in FIG. 1.

In specific implementations, in the above ultrasonic transducer device provided in embodiments of the present disclosure, as shown in FIG. 14, the active layer of the third transistor T3 and the active layer of the fourth transistor T4 are a one-piece structure (both 41), the second pole of the third transistor T3 and the first pole of the fourth transistor T4 are a one-piece structure (referred to as a fourth drain 52), and the second pole 52 of the third transistor T3 is electrically connected to the active layer of the third transistor T3. Thus, the third transistor T3 includes a third active layer 41, a third gate 42, a third source 43, and a fourth drain 52; and the fourth transistor T4 includes a third active layer 41, a fourth gate 51, a third drain 44 (which serves as the source of the fourth transistor in this case) and a fourth drain 52. By adding the fourth drain 52 which is connected to the third active layer 41 through a via hole, a resistance of the transistor can be lowered to improve the signal transmission performance.

In specific implementations, the storage capacitor $C_B$ in the thin film transistor circuit 2 can also be omitted, and the thin film transistor circuit can be simplified by utilizing the capacitor formed by Vdd and the gate of the third transistor T3 instead of the storage capacitor $C_B$.

Figure 15:
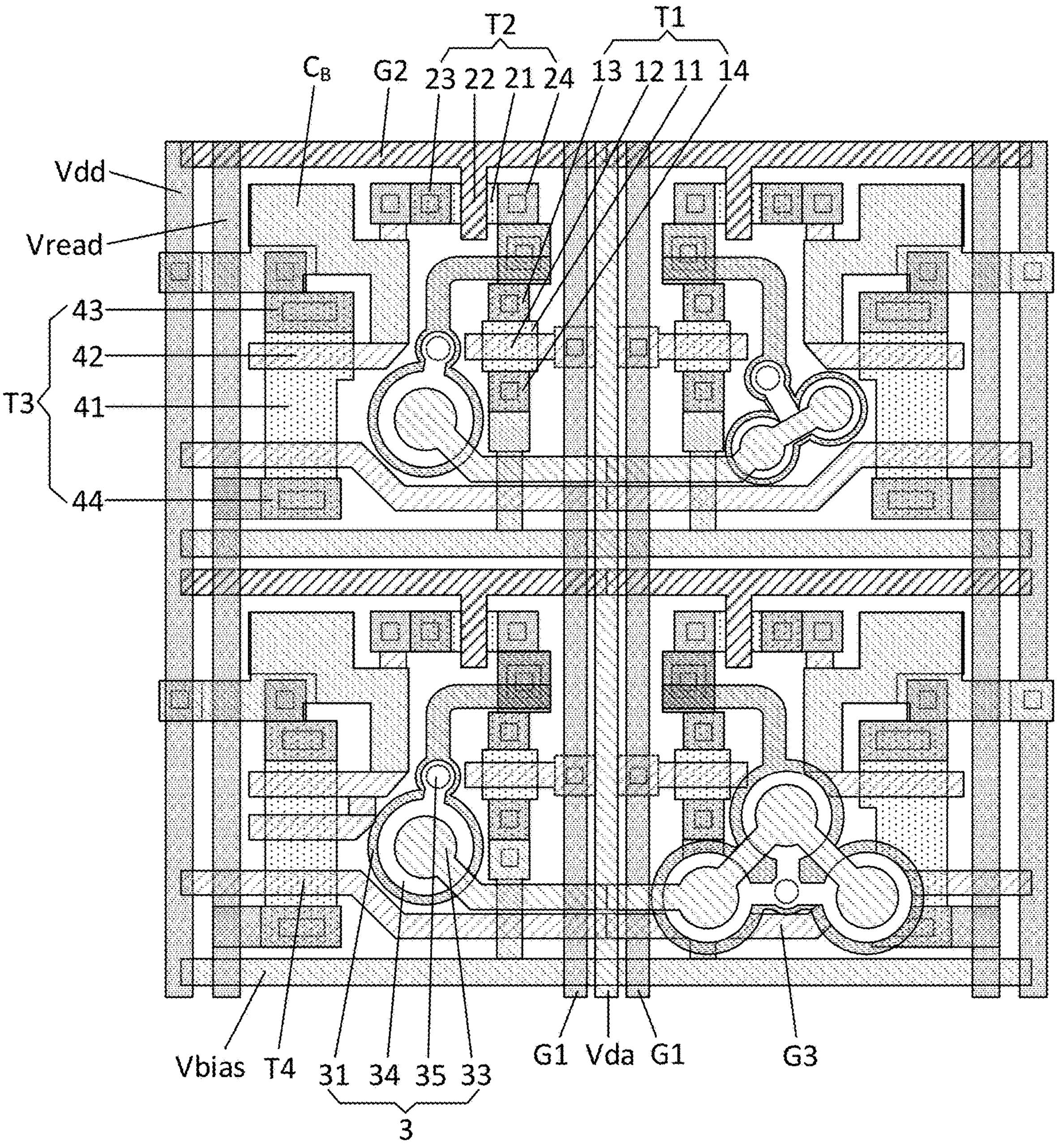
FIG. 15 shows a schematic diagram of another layout corresponding to several ultrasonic units in FIG. 1.
Figure 16:
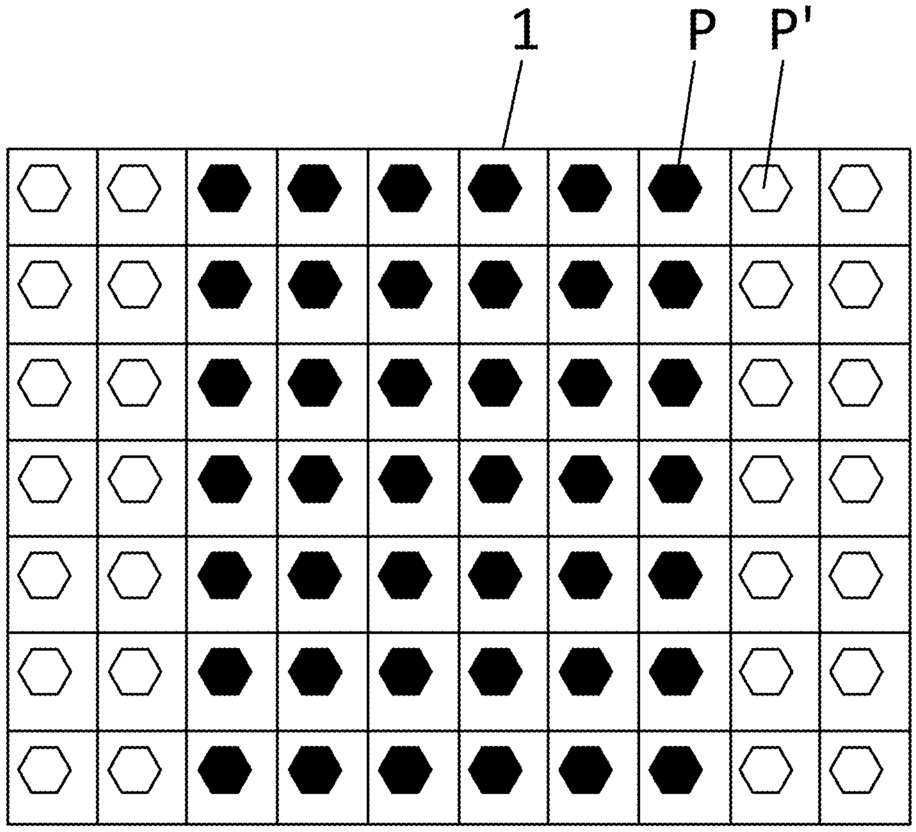
FIG. 16 is a schematic diagram of another planar structure of an ultrasonic transducer device provided by embodiments of the present disclosure.
Figure 17:
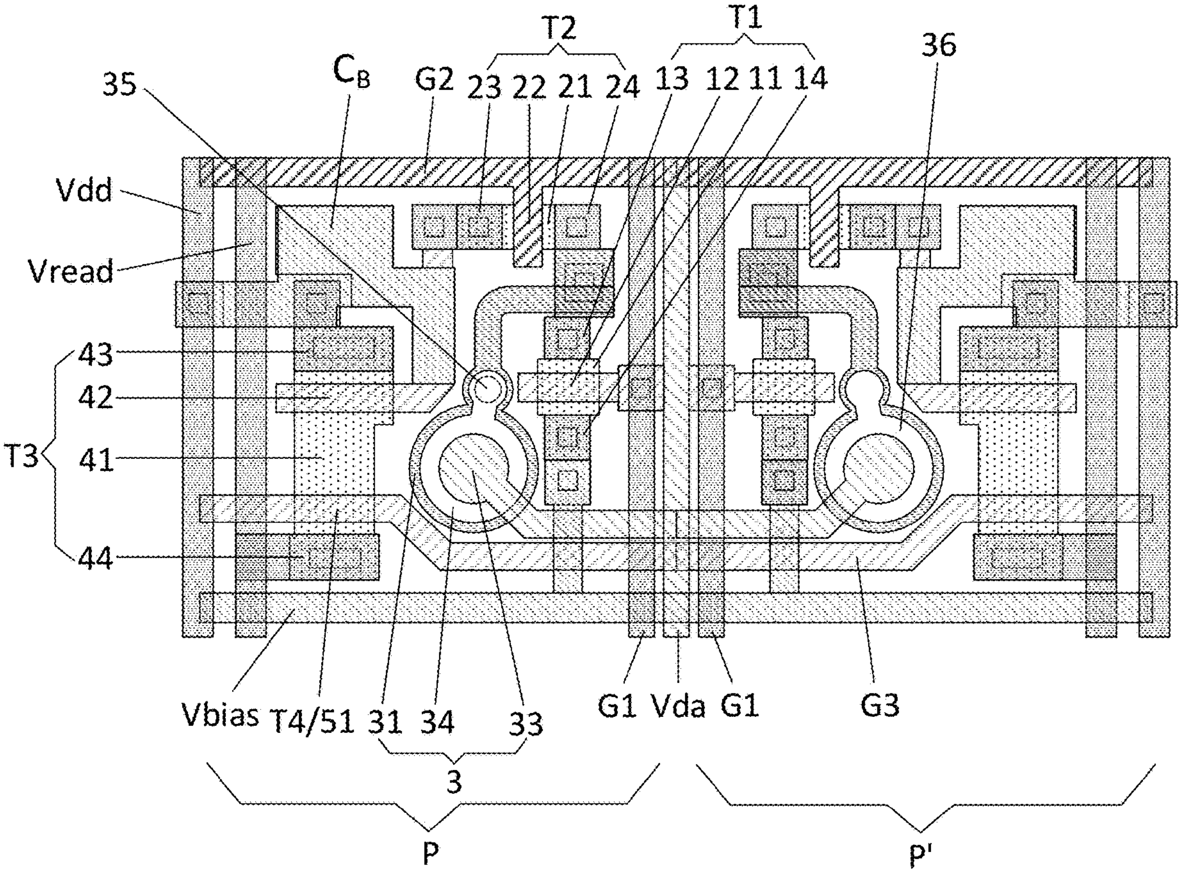
FIG. 17 is a schematic diagram of another layout corresponding to several ultrasonic units in FIG. 1.

In specific implementations, in order to reduce noise during ultrasonic fingerprint identification, in the above ultrasonic transducer device provided by embodiments of the present disclosure, as shown in FIG. 15 which shows another planar schematic diagram of the ultrasonic transducer device, the substrate 1 further includes a virtual ultrasonic unit P' disposed at the outside of the plurality of ultrasonic units P distributed in an array. As shown in FIG. 16, which shows a layout schematic diagram of a ultrasonic unit P and a virtual ultrasonic unit P' in FIG. 15, the virtual ultrasonic unit P' includes the above-mentioned thin film transistor circuit 2 and a second ultrasonic transducer 3'; the second ultrasonic transducer 3' includes a third electrode 31', a second vibrating film layer 32' and a fourth electrode 33' stacked on a side of the thin film transistor circuit 2 facing away from the substrate 1; a sacrificial layer 36 is provided between the third electrode 31' and the second vibrating film layer 32'; the third electrode 31' is electrically connected to the thin film transistor circuit 2; and the fourth electrode 33' is electrically connected to the drive voltage line Vda. Specifically, the virtual ultrasonic unit P' is equivalent to a dummy unit because it retains the sacrificial layer 36, i.e., it does not have the etching hole 35 of the sacrificial layer, and therefore it can neither emit acoustic signals nor receive acoustic signals. The arrangement of the dummy units can be in a variety of ways, and generally a plurality of dummy units are required. The plurality of dummy units can be set in multiple rows and columns, or can be dispersed, etc. FIG. 16 is an example of dummy units on the left and right sides of ultrasonic units P distributed in an array. By setting the virtual ultrasonic units P', the virtual ultrasonic units P' only output the base signals (including noise) generated by the transistors and signal lines, etc., and the pure acoustic signal is obtained by subtracting the base signal of the dummy unit from the signal received by the normal ultrasonic unit P, so that the noise can be greatly reduced and the fingerprint identification accuracy can be improved.

In specific implementations, in the above ultrasonic transducer device provided in embodiments of the present disclosure, the schemes of sharing signal lines, designing two or three first ultrasonic transducers for one ultrasonic unit, designing T3 and T4 with different width-to-length ratios, designing a transistor with a double-gate structure, and adding source-drain electrodes for T3 and T4 mentioned in the above embodiments can be flexibly combined as desired. For example, as shown in FIG. 15, four ultrasonic units P are illustrated, the ultrasonic unit P in the upper left corner is a structure with different width-to-length ratios of T3 and T4, the ultrasonic unit P in the upper right corner is a structure including two first ultrasonic transducers 3, the ultrasonic unit P in the lower left corner is a structure including a third transistor T3 with a double-gate structure, and the ultrasonic unit P in the lower right corner is a structure including three first ultrasonic transducers 3. Herein, the number of the first ultrasonic transducers 3 can make a difference in the emission intensity and the reception sensitivity; different sizes of the first ultrasonic transducers 3 can make a difference between the frequency of the emitted acoustic wave and the frequency of the received signal, which can satisfy some specific needs; and when the design of the first ultrasonic transducers 3 is the same, the design of the transistors is different, which can make a difference in the reception sensitivity of the signal. In this way, different ultrasonic units P in the same ultrasonic transducer device are designed with different structures, and the ultrasonic units P can read different signals and realize different functions, so that the person skilled in the art can design structures of different ultrasonic units P in the same ultrasonic transducer device according to practical needs.

In specific implementations, in the above ultrasonic transducer device provided in embodiments of the present disclosure, as shown in FIGS. 5-15 and FIG. 17, the shape of the cavity 34 may be, but is not limited to, a circle. For example, the cavity can also be a square.

In specific implementations, a material of each film layer in the first ultrasonic transducer, a material of each film layer in the thin film transistor circuit and materials of some other insulating layers are the same as those in the prior art, and will not be described in detail herein.

Figure 18:
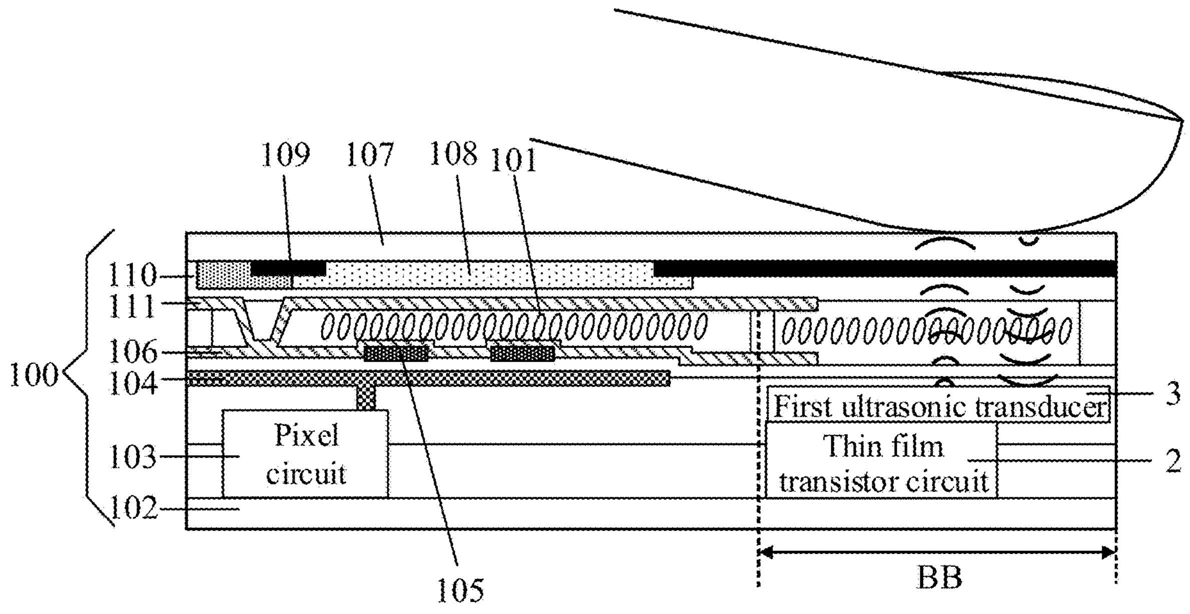
FIG. 18 shows a schematic diagram of a structure of a display apparatus provided by embodiments of the present disclosure.
Figure 19:
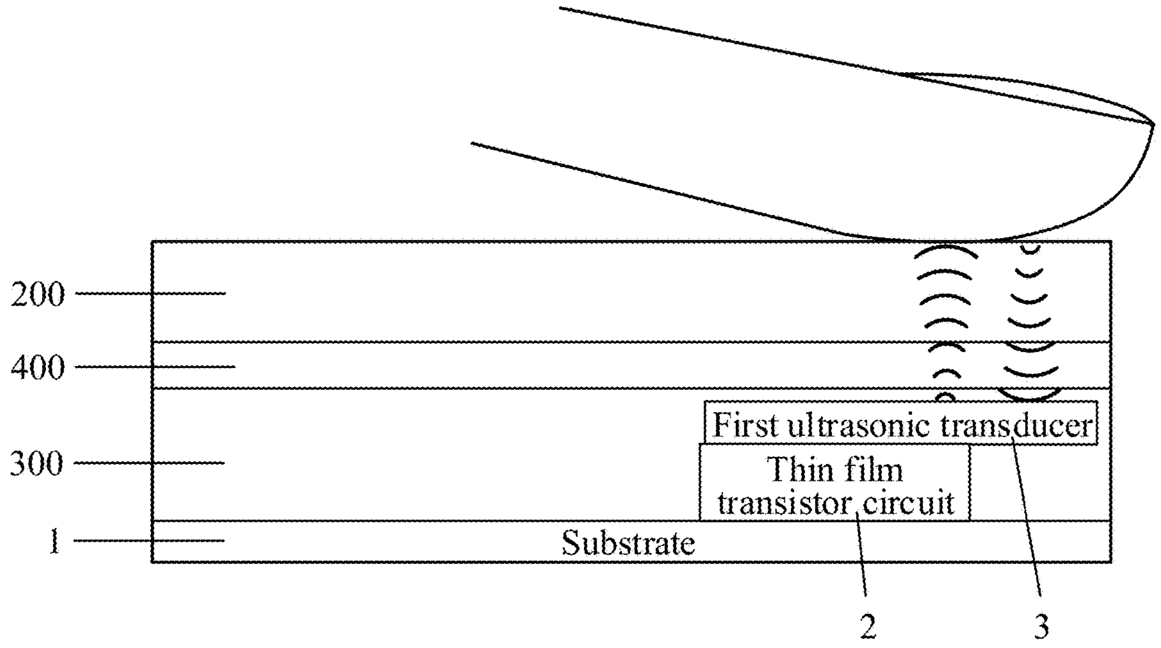
FIG. 19 shows a schematic diagram of another structure of a display apparatus provided by embodiments of the present disclosure.

Based on the same inventive concept, embodiments of the present disclosure also provide a display apparatus, as shown in FIGS. 18 and 19, including a display panel and the above-described ultrasonic transducer device provided by the embodiments of the present disclosure. Since the display apparatus solves the problem in a similar principle as the aforementioned ultrasonic transducer device, the implementation of the display apparatus can be referred to the implementation of the aforementioned ultrasonic transducer device, and the repetitions will not be described.

In specific implementations, in the above-described display apparatus provided in the embodiments of the present disclosure, as shown in FIG. 18, the display panel may be a liquid crystal display panel 100, and each ultrasonic unit P in the ultrasonic transducer device is disposed in a non-light-emitting region BB in the liquid crystal display panel 100. So that, the plurality of ultrasonic units P distributed in an array can be uniformly dispersed in the non-light-emitting region BB of the liquid crystal display panel 100, and the large-area fingerprint identification function can be realized. The fingerprint identification principle can be seen in the description of the above-described ultrasonic transducer device.

Specifically, as shown in FIG. 18, the liquid crystal display panel 100 includes an array substrate and a color film substrate disposed opposite each other, and a liquid crystal layer 101 disposed between the array substrate and the color film substrate. The array substrate includes: a substrate 102, a pixel circuit 103 disposed on the substrate 102, a pixel electrode 104 electrically connected to the pixel circuit 103, a common electrode 105 insulated from the pixel electrode 104, and a first alignment layer 106 between the common electrode 105 and the liquid crystal layer 101. The color film substrate includes: a cover plate 107, a color film layer 108 and a black matrix layer 109 disposed on a side of the cover plate 107 facing the array substrate, a flat layer 110 disposed on a side of the color film layer 108 and the black matrix layer 109 facing the array substrate, and a second alignment layer 111 disposed on a side of the flat layer 110 facing the array substrate.

Specifically, the liquid crystal display panel 100 further includes other indispensable structures known to those skilled in the art, which will not be described in detail herein.

In specific implementations, in the above-described display apparatus provided by embodiments of the present disclosure, as shown in FIG. 19, the display panel may be an organic light-emitting display panel 200, and the ultrasonic transducer device 300 is disposed at the back of the organic light-emitting display panel 200. In this way, a plurality of ultrasonic units P distributed in an array can be uniformly dispersed at the back of the organic light-emitting display panel 200, and the large-area fingerprint identification function can be realized. The fingerprint identification principle can be seen in the description of the above-described ultrasonic transducer device.

In specific implementations, in the above-described display apparatus provided in the embodiments of the present disclosure, as shown in FIG. 19, a transmission layer 400 that facilitates acoustic wave transmission may be disposed between the organic light-emitting display panel 200 and the ultrasonic transducer device 300, and the transmission layer 400 may be an epoxy adhesive material or other materials that can play a role in the efficient transmission of acoustic waves.

It should be noted that the structure of the organic light-emitting display panel is the same as that in the prior art, and will not be described in detail herein.

In specific implementations, the above-described display apparatus provided by the embodiments of the present disclosure may also be a sonic pen, which may emit acoustic waves (one frequency or multiple frequencies). A corresponding structure including the transistor and the CMUT is disposed in a screen of the display apparatus for receiving the acoustic waves. The sonic pen may be used for writing, drawing, and the like.

In specific implementations, the above display apparatus provided by the embodiments of the present disclosure may also be a flat panel speaker or a microphone, which is used as a sound-generating product or to receive sound (voice recognition), etc.

In specific implementations, the above-described display apparatus having an ultrasonic transducer provided by embodiments of the present disclosure can also be used in the field of ultrasonic imaging, such as B-ultrasound in the field of medical imaging, and the like.

Embodiments of the present disclosure provide an ultrasonic transducer device and a display apparatus, which can perform fingerprint identification by combining a thin film transistor circuit and an ultrasonic transducer to form a large-area and arrayed ultrasonic fingerprint identification structure, with a simple structure and high identification accuracy.

Although preferred embodiments of the present disclosure have been described, those skilled in the art may make additional changes and modifications to these embodiments once the basic inventive concepts are known. Therefore, the appended claims are intended to be construed to include the preferred embodiments as well as all changes and modifications that fall within the scope of the present disclosure.

Obviously, a person skilled in the art can make various changes and variations to the embodiments of the present disclosure without departing from the spirit and scope of the embodiments of the present disclosure. Thus, if such modifications and variations of the embodiments of the present disclosure fall within the scope of claims of the present disclosure and their technical equivalents, the present disclosure is intended to include such modifications and variations.

What is claimed is:

1. An ultrasonic transducer device, comprising a substrate, wherein the substrate comprises a plurality of ultrasonic units distributed in an array, and each of the plurality of ultrasonic units comprises:

a thin film transistor circuit disposed on the substrate; and at least one first ultrasonic transducer, disposed on a side of the thin film transistor circuit facing away from the substrate;

wherein the first ultrasonic transducer comprises a first electrode, a first vibrating film layer and a second electrode stacked on the side of the thin film transistor circuit facing away from the substrate;

a cavity is provided between the first electrode and the first vibrating film layer, the first electrode is electrically connected to the thin film transistor circuit, and the second electrode is electrically connected to a drive voltage line.

2. The ultrasonic transducer device according to claim 1, further comprising a plurality of drive signal lines for loading a drive signal to the thin film transistor circuit;

wherein at least two adjacent rows of the ultrasonic units share a same drive signal line, or, at least two adjacent columns of the ultrasonic units share a same drive signal line.

3. The ultrasonic transducer device according to claim 2, wherein the thin film transistor circuit comprises: a first transistor, a second transistor, a third transistor, a fourth transistor, and a storage capacitor;

wherein the plurality of drive signal lines comprise: a first gate line, a second gate line, a third gate line, a first voltage line, a second voltage line, the drive voltage line, and a signal reading line; wherein, a gate of the first transistor is electrically connected to the first gate line, a first pole of the first transistor is electrically connected to the first voltage line, and a second pole of the first transistor is electrically connected to a first pole of the second transistor;

a gate of the second transistor is electrically connected to the second gate line, and a second pole of the second transistor is electrically connected to a gate of the third transistor;

a first pole of the third transistor is electrically connected to the second voltage line, and a second pole of the third transistor is electrically connected to a first pole of the fourth transistor;

a gate of the fourth transistor is electrically connected to the third gate line, and a second pole of the fourth transistor is electrically connected to the signal reading line;

a first end of the storage capacitor is electrically connected to the second voltage line, and a second end of the storage capacitor is electrically connected to the gate of the third transistor; and the first electrode of the first ultrasonic transducer is electrically connected to the first pole of the second transistor.

4. The ultrasonic transducer device according to claim 3, wherein every two adjacent columns of the ultrasonic units is a first group, the drive voltage line is provided at a first gap between two columns of the ultrasonic units in the first group, and the second electrodes of the first ultrasonic transducers in two columns of the ultrasonic units in the same first group are electrically connected to the drive voltage line at the first gap.

5. The ultrasonic transducer device according to claim 4, wherein the first gate line spaced from the drive voltage line is further provided at the first gap, and the gates of the first transistors in two columns of the ultrasonic units in the same first group are electrically connected to the first gate line at the first gap.

6. The ultrasonic transducer device according to claim 4, wherein the second voltage line is provided at a second gap between every two adjacent first groups, and the second voltage line is electrically connected to the first poles of all of the third transistors in two columns of the ultrasonic units on both sides of the second voltage line.

7. The ultrasonic transducer device according to claim 6, wherein two adjacent columns of the ultrasonic units in the same first group are arranged symmetrically about the first gap; and the ultrasonic units of two adjacent first groups are arranged symmetrically about the second gap.

8. The ultrasonic transducer device according to claim 3, wherein every two adjacent rows of the ultrasonic units is a second group, the first voltage line is provided at a third gap between two rows of the ultrasonic units in the second group, and the first poles of all of the first transistors in two rows of the ultrasonic units in the same second group are electrically connected to the first voltage line at the third gap.

9. The ultrasonic transducer device according to claim 8, wherein the second gate line is provided at a fourth gap between every two adjacent second groups, and the second gate line is electrically connected to the gates of all of the second transistors in two rows of the ultrasonic units on both sides of the second gate line.

10. The ultrasonic transducer device according to claim 9, wherein two adjacent rows of the ultrasonic units in the same second group are arranged symmetrically about the third gap, and the ultrasonic units of two adjacent second groups are arranged symmetrically about the fourth gap.

11. The ultrasonic transducer device according to claim 3, wherein a quantity of the first ultrasonic transducers in each of the plurality of ultrasonic units is one or two; and an orthographic projection of each of the first ultrasonic transducers on the substrate does not overlap with orthographic projections of the thin film transistor circuit, the first gate line, the second gate line, the first voltage line, the second voltage line and the drive voltage line on the substrate.

12. The ultrasonic transducer device according to claim 3, wherein a quantity of the first ultrasonic transducers in each of the plurality of ultrasonic units is three; and an orthographic projection of each of the first ultrasonic transducers on the substrate overlaps with orthographic projections of the thin film transistor circuit and the third gate line on the substrate.

13. The ultrasonic transducer device according to claim 11, wherein a quantity of the first ultrasonic transducers in the ultrasonic unit is greater than or equal to two, the first electrodes of the first ultrasonic transducers in the same ultrasonic unit are a one-piece structure, the second electrodes of the first ultrasonic transducers in the same ultrasonic unit are a one-piece structure, and the cavities of the first ultrasonic transducers in the same ultrasonic unit are separated from each other by the first vibrating film layer.

14. The ultrasonic transducer device according to claim 3, wherein a width-to-length ratio of the third transistor is greater than or equal to a width-to-length ratio of the fourth transistor.

15. The ultrasonic transducer device according to claim 3, wherein at least one of the first transistor, the second transistor, the third transistor and the fourth transistor is a double-gate transistor.

16. The ultrasonic transducer device according to claim 3, wherein an active layer of the third transistor and an active layer of the fourth transistor are a one-piece structure, the second pole of the third transistor and the first pole of the fourth transistor are a one-piece structure, and the second pole of the third transistor is electrically connected to the active layer of the third transistor.

17. The ultrasonic transducer device according to claim 1, wherein the substrate further comprises a virtual ultrasonic unit disposed on an outer side of the plurality of ultrasonic units distributed in an array;

the virtual ultrasonic unit comprises the thin film transistor circuit and a second ultrasonic transducer;

the second ultrasonic transducer comprises a third electrode, a second vibrating film layer and a fourth transistor stacked on the side of the thin film transistor circuit facing away from the substrate;

a sacrificial layer is provided between the third electrode and the second vibrating film layer, the third electrode is electrically connected to the thin film transistor circuit, and the fourth electrode is electrically connected to the drive voltage line.

18. A display apparatus, comprising a display panel and the ultrasonic transducer device according to claim 1.

19. The display apparatus according to claim 18, wherein the display panel is a liquid crystal display panel, and each of the plurality of the ultrasonic units in the ultrasonic transducer device is disposed in a non-light-emitting region in the liquid crystal display panel.

20. The display apparatus according to claim 18, wherein the display panel is an organic light-emitting display panel, and the ultrasonic transducer device is disposed at a back of the organic light-emitting display panel.

* * * * *